(12) United States Patent  
Ogura

(10) Patent No.: US 8,217,420 B2  
(45) Date of Patent: Jul. 10, 2012

(54) POWER SEMICONDUCTOR DEVICE

(75) Inventor: Tsuneo Ogura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 12/852,193

(22) Filed: Aug. 6, 2010

(65) Prior Publication Data

US 2011/0042714 A1  Feb. 24, 2011

(30) Foreign Application Priority Data

Aug. 19, 2009  (JP) ................................ 2009-190527

(51) Int. Cl.
*H01L 29/43* (2006.01)
(52) U.S. Cl. .. 257/139; 257/147; 257/331; 257/E29.201
(58) Field of Classification Search .................. 257/139, 257/147, 330–332, 378, E27.197, E29.201
See application file for complete search history.

(56) References Cited

U.S. PATENT DOCUMENTS

| | | | |
|---|---|---|---|
| 6,809,349 B2 * | 10/2004 | Yamaguchi et al. | 257/133 |
| 6,936,893 B2 * | 8/2005 | Tanaka et al. | 257/341 |
| 7,456,487 B2 * | 11/2008 | Ogura et al. | 257/565 |
| 7,622,754 B2 * | 11/2009 | Tamada | 257/139 |
| 2010/0308401 A1 * | 12/2010 | Narazaki | 257/330 |

FOREIGN PATENT DOCUMENTS

| | | |
|---|---|---|
| JP | 11054747 | 2/1999 |
| JP | 2004-363328 | 12/2004 |
| JP | 2009-021557 | 1/2009 |

OTHER PUBLICATIONS

Japanese Office Action dated Dec. 27, 2011, filed in Japanese counterpart Application No. 2009-190527, 6 pages (with English translation).

* cited by examiner

*Primary Examiner* — Tuan N. Quach
(74) *Attorney, Agent, or Firm* — Patterson & Sheridan, LLP

(57) ABSTRACT

According to one embodiment, a power semiconductor device includes an IGBT region, first and second electrodes, and a first conductivity-type second semiconductor layer. The region functions as an IGBT element. The first electrode is formed in a surface of a second conductivity-type collector layer opposite to a first conductivity-type first semiconductor layer in the region. The second electrode is connected onto a first conductivity-type emitter layer and a second conductivity-type base layer in a surface of the first conductivity-type base layer and insulated from a gate electrode in the region. The first conductivity-type second semiconductor layer extends from the surface of the first conductivity-type base layer to the first conductivity-type first semiconductor layer around the IGBT region, and connected to the first electrode.

18 Claims, 11 Drawing Sheets

POWER SEMICONDUCTOR DEVICE

CROSS-REFERENCE TO RELATED APPLICATIONS

This application is based upon and claims the benefit of priority from the prior Japanese Patent Application No. 2009-190527, filed on Aug. 19, 2009; the entire contents of which are incorporated herein by reference.

FIELD

Embodiments described herein relate generally to a power semiconductor device used in an electric appliance.

BACKGROUND

IGBTs (insulated gate bipolar transistors) are widely used as power semiconductor elements with a breakdown voltage of approximately 300 V or more. Such IGBTs are often used as switching elements in power supply circuits and inverter circuits. In this case, a free-wheeling diode connected in reverse parallel to the IGBT is needed to pass a sustaining current due to the inductor in these circuits or in the loads connected to these circuits. There is demand for downsizing of power semiconductor devices. Furthermore, there is demand for a power semiconductor device including a free-wheeling diode and an IGBT element in the same chip.

In a power semiconductor device including an IGBT and a free-wheeling diode in the same chip, in order to prevent extension of the depletion layer to the dicing line of the chip, an n-type channel stopper layer is provided at the surface of the terminal portion of the IGBT chip. This serves as a cathode layer electrically connected to the collector electrode of the IGBT. Furthermore, a p-type diffusion layer formed at the outer periphery of the IGBT element region serves as an anode layer connected to the emitter electrode of the IGBT element. A free-wheeling diode, with this p-type diffusion layer serving as an anode layer and the channel stopper layer serving as a cathode layer, is integrally formed so as to be connected in reverse parallel to the IGBT region.

In such a power semiconductor device, when a positive voltage relative to the collector electrode of the IGBT is applied to the emitter electrode, a current flows in the free-wheeling diode along a path composed of the emitter electrode, p-type semiconductor layer, n-type epitaxial layer, channel stopper layer, and collector electrode. However, in this free-wheeling diode, the current concentrates near the surface of the n-type epitaxial layer, and hence the on-resistance of the free-wheeling diode is relatively high.

DETAILED DESCRIPTION

Figure 1:
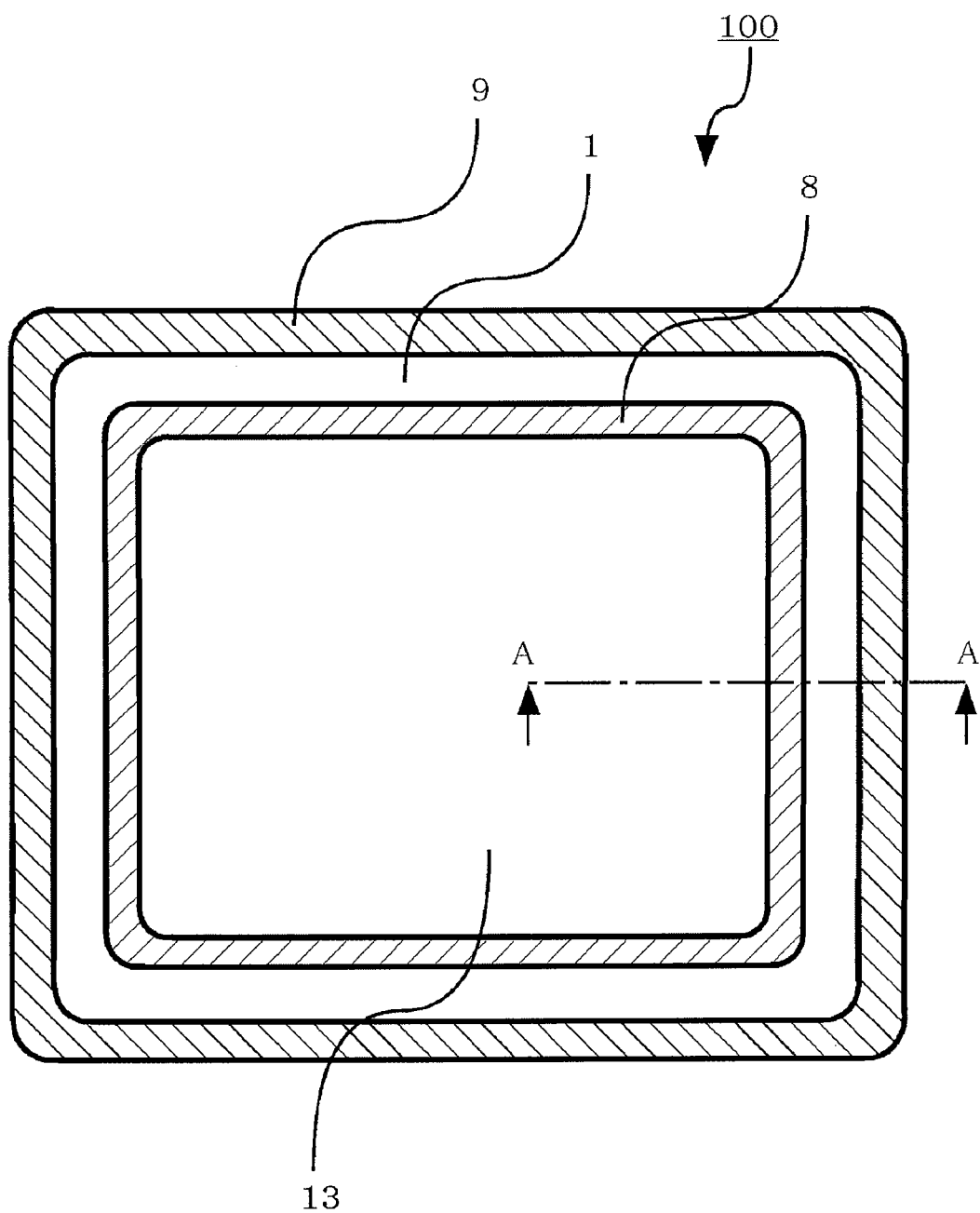
FIG. 1 is a plan view of a power semiconductor device of Embodiment 1 of the invention.

In general, according to one embodiment, a power semiconductor device includes an IGBT region, a first main electrode, a second main electrode, a first conductivity-type second semiconductor layer. The IGBT region includes a plurality of IGBT units. Each of the IGBT units includes a first conductivity-type base layer, a second conductivity-type base layer, a first conductivity-type emitter layer, a gate electrode, a first conductivity-type first semiconductor layer, and a second conductivity-type collector layer. The first conductivity-type base layer has a first surface and a second surface opposed to the first surface. The second conductivity-type base layer is selectively formed on the first surface of the first conductivity-type base layer. The first conductivity-type emitter layer is formed in a surface of the second conductivity-type base layer opposite to the first conductivity-type base layer. The gate electrode is formed on the first conductivity-type base layer, the second conductivity-type base layer, and the first conductivity-type emitter layer via a gate insulating film. The first conductivity-type first semiconductor layer is formed on the second surface of the first conductivity-type base layer. The first conductivity-type first semiconductor layer has a higher impurity concentration than the first first conductivity-type base layer. The second conductivity-type collector layer is formed in a surface of the first conductivity-type first semiconductor layer opposite to the first conductivity-type base layer. The first main electrode is formed in a surface of the second conductivity-type collector layer opposite to the first conductivity-type first semiconductor layer. The second main electrode is electrically connected onto the first conductivity-type emitter layer and the second conductivity-type base layer and insulated from the gate electrode by an interlayer insulating film. The first conductivity-type second semiconductor layer extends from the first surface of the first conductivity-type base layer to the first conductivity-type first semiconductor layer around the IGBT region and electrically connected to the first main electrode.

Embodiments of the invention will now be described with reference to the drawings. Although the embodiments are described assuming that the first conductivity type is n-type and the second conductivity type is p-type, the embodiments can also be practiced with these types interchanged. In the case where n-type impurity layers are labeled with symbols n(−), n, and n(+), the n-type impurity concentration in those layers increases in the order of n(−)≦n≦n(+). This also applies to p-type impurity layers. Furthermore, unless otherwise specified, the impurity concentration refers to the net impurity concentration after compensation between the conductivity types.

The figures used in describing the embodiments are schematic for ease of description, and the shape, dimension, size relation and the like of components in the figures are not necessarily the same as shown in the figures when they are actually put into practice. Furthermore, the shape, dimension, size relation, impurity concentration, material and the like can be modified as long as the effect of the invention is achieved.

Furthermore, unless otherwise specified, the semiconductor layer (including the base layer, collector layer, emitter layer, anode layer, cathode layer and the like) refers to a semiconductor layer illustratively made of Si (silicon). However, other semiconductor layers, such as those made of SiC and GaN, can also be used.

Embodiment 1

Figure 2:
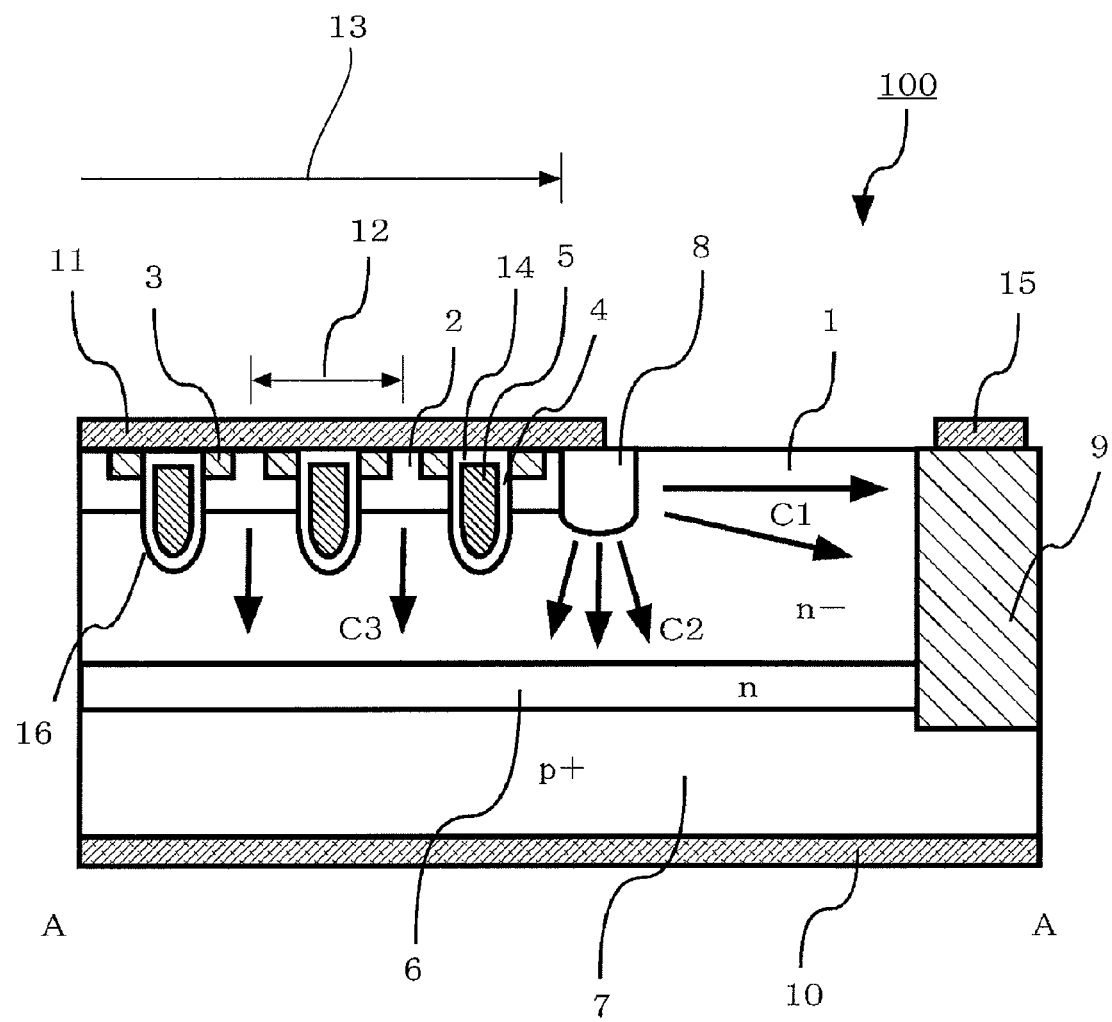
FIG. 2 is a cross-sectional view of the major part of the power semiconductor device of Embodiment 1 of the invention.

FIG. 1 is a plan view of a power semiconductor device of Embodiment 1 of the invention, and FIG. 2 shows the A-A cross section of FIG. 1 as viewed in the direction of the arrows. In FIG. 1, a first guard ring layer 8, n(−)-type base layer 1, n-type second semiconductor layer 9, and IGBT region 13 are shown in plan view, but the detailed structure in the IGBT region 13 and other components are omitted.

A power semiconductor device 100 of this embodiment includes an n(−)-type (first conductivity-type) base layer 1 having a first surface and a second surface opposed to the first surface. The impurity concentration of the n-type base layer 1 is e.g. approximately 1e12 to 1e15/cm$^3$, and suitably selected depending on the breakdown voltage required for the power semiconductor device 100. A p-type (second conductivity-type) base layer 2 is formed in the first surface of the n(−)-type base layer 1. The impurity concentration of the p-type base layer 2 is e.g. approximately 1e16 to 1e18/cm$^3$. An n-type emitter layer 3 is selectively formed in the surface of the p-type base layer 2. The impurity concentration of the n-type emitter layer 3 is suitably selected so that ohmic contact can be formed with the emitter electrode (second main electrode) 11 described later. A trench 16 penetrating from the surface of the n-type emitter layer 3 through the n-type emitter layer 3 and the p-type base layer 2 into the n(−)-type base layer is formed, and a gate electrode 5 is formed in this trench via a gate insulating film 4 so as to fill the trench 16. The gate insulating film 4 is illustratively an oxide film formed by thermally oxidizing the Si surface of the trench 16. The gate electrode 5 is illustratively made of polysilicon. An interlayer insulating film 14 is formed above the gate electrode 5 so that the gate electrode 5 is insulated from the n(−)-type base layer 1, the p-type base layer 2, the n-type emitter layer 3, and the emitter electrode 11 described later.

An n-type first semiconductor layer 6 is formed on the second surface of the n(−)-type base layer 1, and has a higher impurity concentration than the n(−)-type base layer 1, such as 1e15 to 1e17/cm$^3$. A p(+)-type collector layer 7 is formed on the surface of the n-type first semiconductor layer 6 opposite to the n(−)-type base layer 1.

With the gate electrode 5 at the center, the region composed of the p(+)-type collector layer 7, the n-type first semiconductor layer 6, the n(−)-type base layer 1, the p-type base layer 2, the gate electrode 5, and the n-type emitter layer 3 opposed to the gate electrode 5 on both ends of the gate electrode 5 via the gate insulating film 4 is an IGBT unit 12 functioning as one IGBT element. This IGBT unit 12 is repeated in the plane of the n(−)-type base layer 1 to form an IGBT region 13. Here, as shown in FIG. 2, it is also possible to use a structure in which the n-type emitter layer 3 is not provided on the outer peripheral side of the outermost IGBT unit 12 to suppress latch-up due to avalanche current in the end portion of the p-type base layer 2.

A p-type first guard ring layer 8 extends from the first surface toward the second surface of the n(−)-type base layer 1 so as to surround the IGBT region 13. More specifically, the first guard ring layer 8 can have a ring-shaped structure surrounding the IGBT region 13. The depth of the first guard ring layer 8 is formed more deeply than the bottom of the p-type base layer 2. The first guard ring layer 8 has an impurity concentration of approximately 1e18 to 1e20/cm$^3$ and serves to cause the depletion layer extending from the interface between the p-type base layer 2 and the n(−)-type base layer 1 at the outer peripheral end of the p-type base layer 2 to extend not only toward the n-type first semiconductor layer 6 but also toward a chip end portion. This suppresses breakdown at the outer peripheral end of the p-type base layer 2 due to electric field concentration. The first guard ring layer 8 can be formed illustratively by ion implantation of a p-type impurity such as boron followed by a thermal diffusion process.

An n(+)-type second semiconductor layer 9 extends from the first surface of the n(−)-type base layer 1 to the n-type first semiconductor layer 6 so as to further surround the first guard ring layer 8 outside the IGBT region 13. As shown in FIG. 1, in the case where the first guard ring layer 8 is illustratively shaped like a rectangle, such as a square, in plan view, the n(+)-type second semiconductor layer 9 may have a rectangular ring-shaped structure so as to surround all the four sides of the first guard ring layer, or may be shaped like a letter U so that three sides, except one side, of the first guard ring layer 8 are enclosed in plan view (not shown). Alternatively, the n(+)-type second semiconductor layer 9 may be formed opposite to only one side of the first guard ring layer 8 in plan view (not shown). However, in this case, the area in which the n(+)-type second semiconductor layer 9 serving as a cathode layer is opposed to the first guard ring layer 8, i.e., the cross-sectional area of the current path of the free-wheeling diode, decreases, and hence the on-resistance is higher than in the case where the n(+)-type second semiconductor layer 9 has a ring-shaped structure.

Furthermore, as long as the n(+)-type second semiconductor layer 9 reaches the n-type first semiconductor layer 6 and is electrically joined thereto, it may be joined at the surface of the n-type first semiconductor layer 6 on the n(−)-type base layer 1 side, may be joined by digging into the n-type first semiconductor layer 6, or may penetrate through the n-type first semiconductor layer 6 to the p-type collector layer 7. The impurity concentration of the n(+)-type second semiconductor layer 9 can be at least comparable to, and preferably higher than the impurity concentration of the n-type first semiconductor layer 6. The n(+)-type second semiconductor layer 9 serves as a cathode layer of the free-wheeling diode described later. Hence, to reduce the on-resistance of the free-wheeling diode, for instance, the impurity concentration is desirably set to approximately 1e18 to 1e20/cm$^3$. However, even for a lower impurity concentration, there is an effect of accelerating the switching rate of the free-wheeling diode, for instance.

The n(+)-type second semiconductor layer 9 can be formed by ion implantation from the first surface of the n(−)-type base layer 1 followed by a thermal diffusion process. Alternatively, it can also be formed by forming a trench illustratively by anisotropic etching such as dry etching or isotropic etching such as wet etching, and filling the trench with an n-type semiconductor layer such as an Si epitaxial layer or polysilicon layer.

A first main electrode 10 is formed on the surface of the p(+)-type collector layer 7 opposite to the n-type first semiconductor layer 6 and electrically connected to the p(+)-type collector layer 7. A second main electrode is electrically connected to the upper surface of each of the p-type base layer 2 and the n-type emitter layer 3, insulated from the gate electrode 5 by the interlayer insulating film 14, and electrically connected to the upper surface of the first guard ring layer 8 beyond the gate electrode 5.

A cathode electrode 15 is formed on the surface of the n(+)-type second semiconductor layer 9 opposite to the first main electrode side and electrically joined to the first main electrode. For instance, such a junction can be formed by using a bonding wire or the like (not shown) to electrically join the cathode electrode 15 to a lead frame electrically joined to the power semiconductor device 100 via the first main electrode.

By the aforementioned electrode connection, in the IGBT region 13, an IGBT structure is formed in which the first main electrode acts as a collector electrode, the second main electrode acts as an emitter electrode, and the current flowing from the first main electrode toward the second main electrode is controlled by the gate electrode. Furthermore, a free-wheeling diode is formed in which the p-type first guard ring layer 8 and the p-type base layer 2 function as an anode layer and the n-type first semiconductor layer 6 and the n(+)-type second semiconductor layer 9 function as a cathode layer. In this free-wheeling diode, the p-type first guard ring layer 8 and the p-type base layer 2 serving as an anode layer are connected to the second main electrode 11, and the n-type first semiconductor layer 6 and the n(+)-type second semiconductor layer 9 serving as a cathode layer are electrically connected to the first main electrode 10 via the cathode electrode 15. Thus, the free-wheeling diode constitutes a reverse parallel connection with the IGBT region 13, and they are formed in the same semiconductor chip.

Next, the operation of the power semiconductor device 100 of this embodiment is described. In the state of voltage application in which the first main electrode 10 is placed at a positive potential with respect to the second main electrode 11, a voltage is applied so that the gate electrode 5 is placed at a positive potential higher than a threshold with respect to the second main electrode 11. Then, an n-channel layer is formed in the portion of the p-type base layer 2 opposed to the gate electrode 5 by inversion distribution. When electrons are injected from the second main electrode through the n-type emitter layer 3 and the channel layer into the n(−)-type drift layer 1, holes are injected from the first main electrode through the p(+)-type collector layer 7 and the n-type first semiconductor layer 6 into the n(−)-type drift layer 1, causing conductivity modulation and resulting in the on-state. The holes subsequently flow through the p-type base layer 2 to the second main electrode, and the electrons flow through the n-type first semiconductor layer 6 and the p(+)-type collector layer 7 to the first main electrode. Consequently, in the IGBT region 13, the current flows from the first main electrode to the second main electrode. On the other hand, when the IGBT region is turned off and a voltage is applied so that the second main electrode is placed at a positive potential with respect to the first main electrode, the current flows from the second main electrode to the p-type first guard ring layer 8, (1) part of the current flows into the second semiconductor layer 9 through a current path C1 radially extending in the surface of the n(−)-type drift layer 1 from the p-type first guard ring layer 8 toward the n-type second semiconductor layer 9, and (2) another part flows into the first semiconductor layer 6 through a current path C2 radially extending in the depth direction of the n(−)-type drift layer 1 from the p-type first guard ring layer 8 toward the n-type first semiconductor layer 6, and flows along the plane of the first semiconductor layer into the second semiconductor layer 9. Furthermore, (3) the current flows from the second main electrode to the p-type base layer 2, flows into the first semiconductor layer 6 through a current path C3 in the depth direction of the n(−)-type drift layer 1 from the p-type base layer 2 toward the n-type first semiconductor layer 6, and flows along the plane of the first semiconductor layer 6 into the second semiconductor layer 9. The current through the current path C1 and the current through the current paths C2 and C3 merge in the second semiconductor layer 9 and flow through the cathode electrode 15 to the first main electrode. Consequently, this turns on the free-wheeling diode in which the first guard ring layer 8 and the p-type base layer 2 serve as an anode layer and the first semiconductor layer 6 and the second semiconductor layer 9 serve as a cathode layer, and a current flows from the second main electrode toward the first main electrode.

Figure 3:
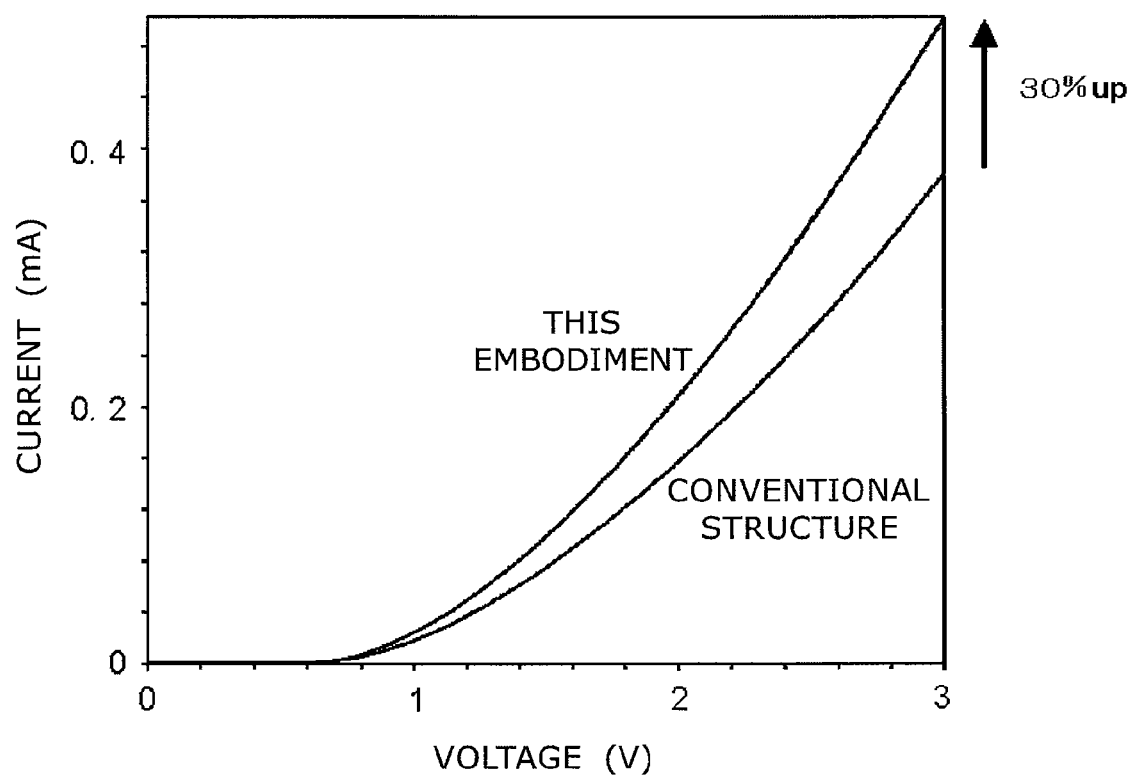
FIG. 3 is a diagram showing the voltage-current characteristic of the power semiconductor device of Embodiment 1 of the invention.

The free-wheeling diode of the power semiconductor device 100 of this embodiment has a structure in which the n(+)-type second semiconductor layer 9 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 9 to function as a cathode layer, but also the n-type first semiconductor layer 6 to function as a cathode layer. Consequently, in contrast to the conventional power semiconductor device including the free-wheeling diode described in JP-A H11-54747 (Kokai) in which the current of the free-wheeling diode flows only near the surface of the n(−)-type base layer 1 (includes only the current path C1 near the surface), the free-wheeling diode of this embodiment further includes the current paths C2 and C3 for flow in the depth direction of the n(−)-type base layer 1, and hence the on-resistance of the free-wheeling diode can be further reduced. Here, FIG. 3 shows a result of simulation-based comparison between the voltage-current characteristics of the free-wheeling diode of the conventional structure with a cathode layer formed like a ring in the surface of the n(−)-type base layer and those of the free-wheeling diode according to this embodiment. As shown, according to the invention, at the same on-voltage, the current density can be increased by 30% or more. This effect is attributed to the fact that the distance from the p-type first guard ring layer 8 and the p-type base layer 2 to the n-type first semiconductor layer 6 is typically shorter than the distance from the p-type first guard ring layer 8 to the n(+)-type second semiconductor layer 9, in addition to the increased area of the cathode of the free-wheeling diode according to this embodiment. Thus, this is a special effect of the invention.

The on-resistance of the free-wheeling diode of this embodiment is determined by the distance from the p-type first guard ring layer 8 and the p-type base layer 2 to the n-type first semiconductor layer 6 and the n(+)-type second semiconductor layer 9, and the respective impurity concentrations. Increasing the impurity concentration of the n-type first semiconductor layer 6 is undesirable because it suppresses the injection of holes from the p(+)-type collector layer 7 in the operation of the IGBT. Hence, it is desirably suppressed to approximately 1e15 to 1e17/cm$^3$. Thus, the reduction of the on-resistance of the free-wheeling diode desirably relies on increasing the impurity concentration of the n(+)-type second semiconductor layer 9. The impurity concentration of the n(+)-type second semiconductor layer is desirably set to approximately 1e18 to 1e20/cm$^3$ but can be as low as that of the n-type first semiconductor layer 6. In this case, at the expense of on-resistance, the fast responsiveness of the free-wheeling diode is improved.

The trench gate electrode in the IGBT region may be shaped like a stripe extending in one direction, or can have a lattice or staggered structure, for instance. In the case where the gate electrode 5 is shaped like a stripe, the n-type emitter layer 3 may be shaped like a stripe extending along the stripe direction of the gate electrode 5, or it is also possible to use a structure in which the n-type emitter layer 3 and the p-type base layer 2 are alternately arranged. Furthermore, although the gate electrode has been described in the case of a trench gate structure, naturally it is also possible to use a planar gate electrode described later in Variation 1 of this embodiment. Furthermore, it is clear that any known IGBT structure can be combined with the free-wheeling diode according to the invention.

The first guard ring layer 8 has been described as a layer which is independent of and deeper than the p-type base layer 2. In reality, the p-type base layer 2 is often formed to also serve as the first guard ring layer 8 primarily for cost reduction. However, even in this case, it is clear that the p-type base layer 2 functions as the anode layer of the free-wheeling diode according to the invention and is applicable to the structure of the invention.

These modifications are all applicable also to the following embodiments and variations.

As described above, the distance from the p-type first guard ring layer 8 and the p-type base layer 2 to the n-type first semiconductor layer 6 is typically shorter than the distance from the p-type first guard ring layer 8 to the n(+)-type second semiconductor layer 9. This assumes the case where the distance from the p-type first guard ring layer 8 to the n(+)-type second semiconductor layer 9 is lengthened to weaken the surface electric field to obtain a desired breakdown voltage. However, rather than the conventional n(+)-type second semiconductor layer formed only in the surface, the n(+)-type second semiconductor layer 9 formed to reach the n-type first semiconductor layer 6 as in this invention can suppress extension of the surface electric field to the terminal portion. Hence, the length of the terminal portion can be shortened. This is a special effect of the invention, which can also further improve the characteristics of the diode. That is, the invention can achieve the double effect of improving the characteristics of the integrated diode and reducing the area of the terminal portion.

Figure 4:
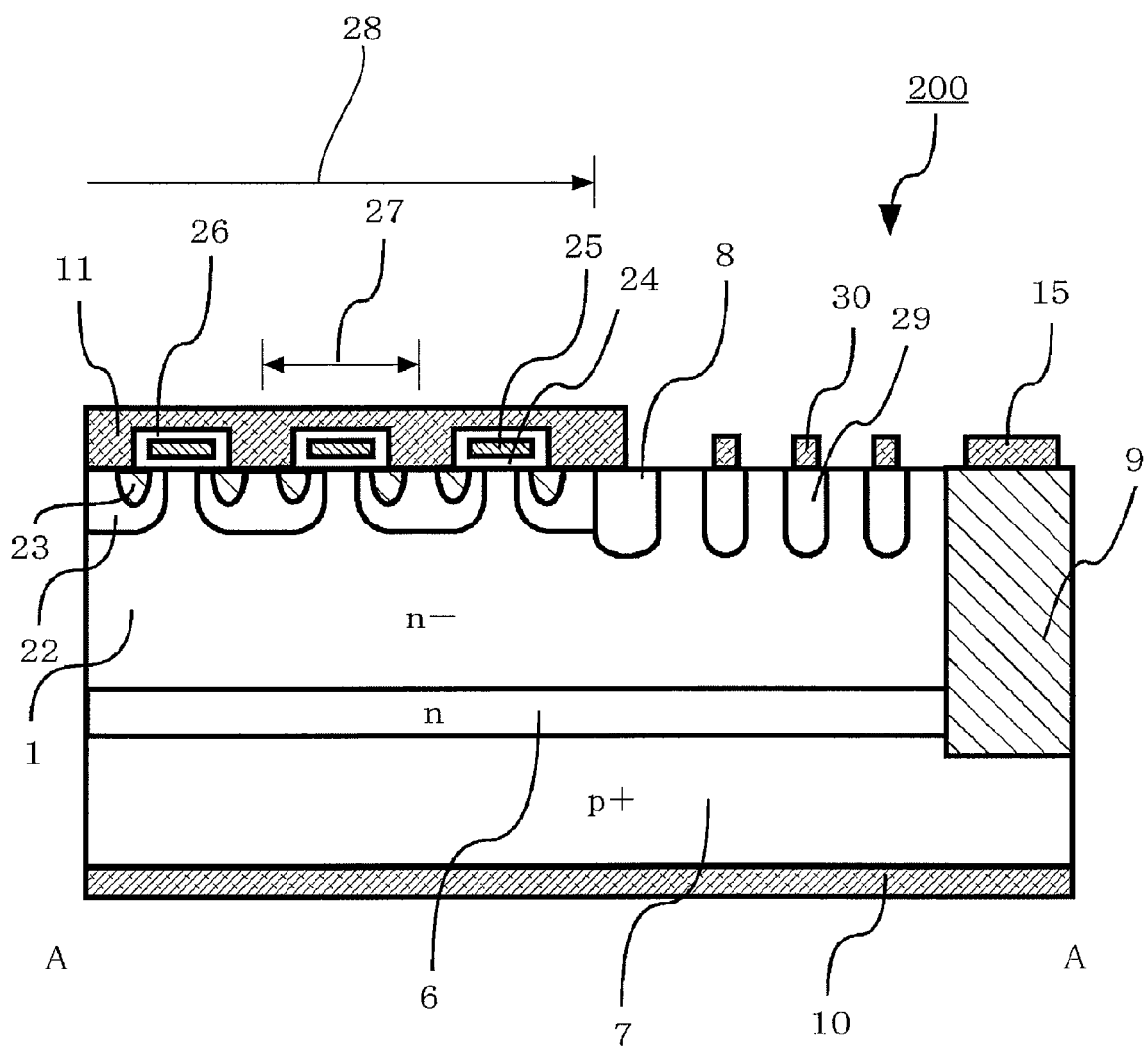
FIG. 4 is a cross-sectional view of the major part of a power semiconductor device of a variation of Embodiment 1 of the invention.

FIG. 4 shows a sectional view of the major part of a power semiconductor device 200 of Variation 1 of Embodiment 1 of the invention. The plan view of the power semiconductor device 200 is generally the same as FIG. 1, and FIG. 4 corresponds to the sectional view of the A-A cross section of FIG. 1 as viewed in the direction of the arrows. In the following description, portions identical or similar to those of the above Embodiment 1 are labeled with like reference numerals, and only the portions different from those of Embodiment 1 are described.

The power semiconductor device 200 of this variation is different from the power semiconductor device 100 of Embodiment 1 in that the gate electrode has a planar structure instead of the trench structure. Another difference from the power semiconductor device 100 of Embodiment 1 is that a p-type second guard ring layer 29 is provided between the p-type first guard ring layer 8 and the n(+)-type second semiconductor layer 9. The rest is similar to Embodiment 1. This difference is described below.

In the power semiconductor device 200 of this variation, a p-type base layer 22 is selectively formed on the first surface of the n(−)-type base layer 1. An n-type emitter layer 23 is selectively formed in the surface of the p-type base layer 22. A planar gate electrode 25 is formed on the surface of the n-type emitter layer 23, the p-type base layer 22, and the n(−)-type base layer 1 via a gate insulating film 24. An interlayer insulating film 26 is formed so as to cover the gate electrode 25. The second main electrode is insulated from the gate electrode 25 by the interlayer insulating film 26 and electrically connected to the surface of the n-type emitter layer 23, the p-type base layer 22, and the p-type first guard ring layer 8.

The p-type second guard ring layer 29 extends from the surface of the n(−)-type base layer 1 toward the first main electrode so as to surround the p-type first guard ring layer 8, more specifically in a ring-shaped structure, between the p-type first guard ring layer 8 and the n-type second semiconductor layer 9. This second guard ring layer 29 is integrally formed in the same process as the first guard ring layer, and the depth and impurity concentration are the same as the first guad ring layer. These layers can be formed by ion implantation of a p-type impurity followed by thermal diffusion. Alternatively, they can also be formed by forming trenches and filling the trenches with an Si epitaxial layer, polysilicon layer or the like. In FIG. 4, the second guard ring layer 29 is formed in a ring-shaped structure at three positions concentrically about the center of the IGBT region. However, whether it is formed singly or in a plurality can be suitably selected.

On the surface of the respective second guard ring layers 29 at three positions, guard ring electrodes 30 electrically connected thereto are formed, and these are insulated from each other and placed in a floating state.

Like the free-wheeling diode of the power semiconductor device 100 of Embodiment 1, the power semiconductor device 200 of this variation also has a structure in which the n(+)-type second semiconductor layer 9 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 9 to function as a cathode layer, but also the n-type first semiconductor layer 6 to function as a cathode layer. Consequently, in addition to flowing near the surface of the n(−)-type base layer 1 (including the current path near the surface), the current of the free-wheeling diode also includes the current paths for flow in the depth direction, and hence the on-resistance of the free-wheeling diode can be reduced.

Furthermore, the second guard ring layer 29 serves to increase the breakdown voltage in the chip terminal portion as compared with the power semiconductor device 100 of Embodiment 1.

Figure 5:
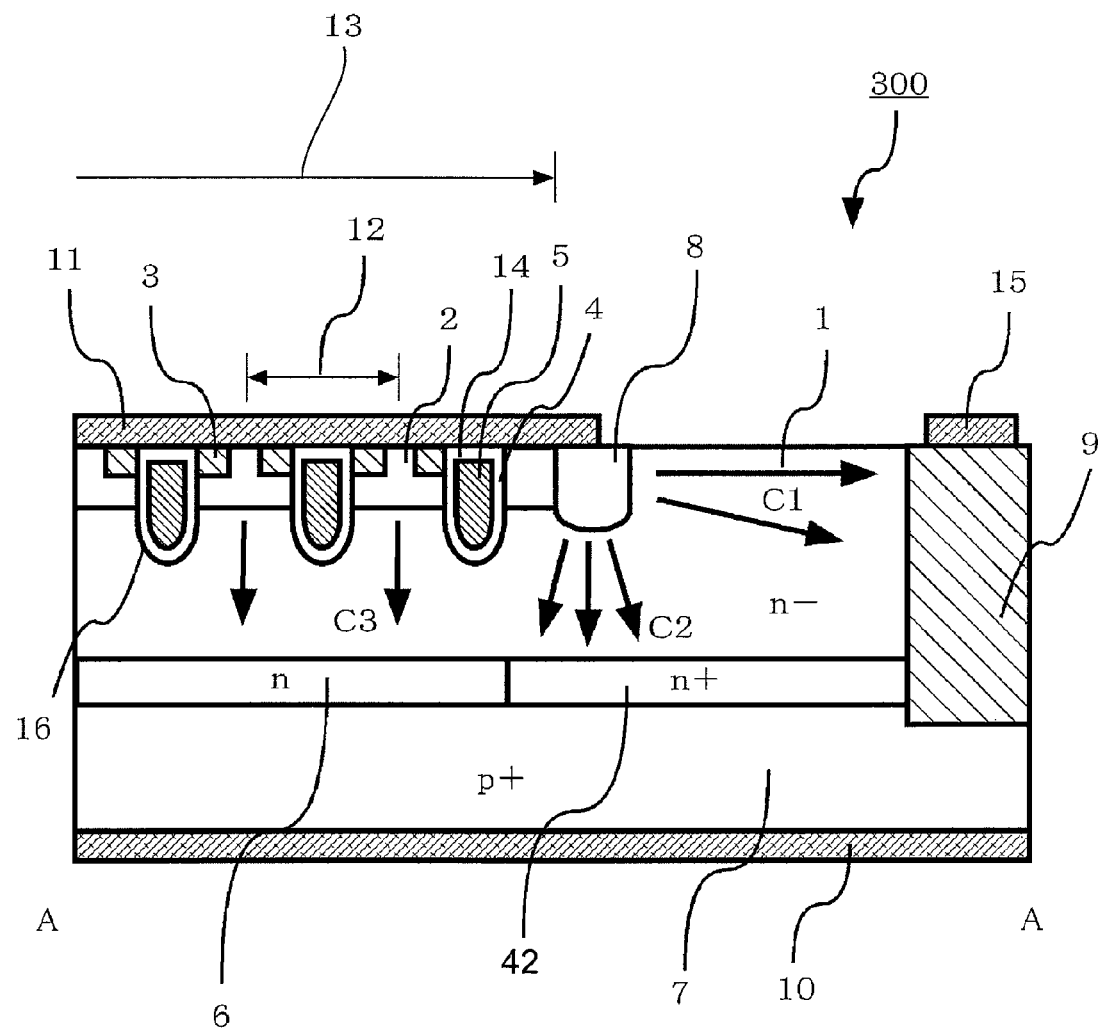
FIG. 5 is a cross-sectional view of the major part of a power semiconductor device of another variation of Embodiment 1 of the invention.

FIG. 5 shows a sectional view of the major part of a power semiconductor device 300 of Variation 2 of Embodiment 1 of the invention. The plan view of the power semiconductor device 300 is generally the same as FIG. 1, and FIG. 5 corresponds to the sectional view of the A-A cross section of FIG. 1 as viewed in the direction of the arrows. In the following description, portions identical or similar to those of the above Embodiment 1 are labeled with like reference numerals, and only the portions different from those of Embodiment 1 are described.

The power semiconductor device 300 of this variation is different from the power semiconductor device 100 of Embodiment 1 in that the n-type first semiconductor layer 6 further includes an n(+)-type third semiconductor layer 42 in its plane. In other words, in the power semiconductor device 300, the region of the n-type first semiconductor layer 6 extending at least from immediately below the p-type first guard ring layer 8 to the portion where the n(+)-type second semiconductor layer 9 reaches the n-type first semiconductor layer 6, constitutes an n(+)-type third semiconductor layer 42 having a higher impurity concentration than the n-type first semiconductor layer 6. The rest is similar to Embodiment 1.

Like the free-wheeling diode of the power semiconductor device 100 of Embodiment 1, the power semiconductor device 300 of this variation also has a structure in which the n(+)-type second semiconductor layer 9 serving as a cathode layer extends from the first surface toward the second surface of the n(−)-type base layer 1, reaches the n(+)-type third semiconductor layer 42 constituting part of the n-type first semiconductor layer 6, and is electrically connected to the n-type first semiconductor layer 6 and the n(+)-type third semiconductor layer 42. Hence, it is characterized in causing not only the n(+)-type second semiconductor layer 9 to function as a cathode layer, but also the n-type first semiconductor layer 6 and the n(+)-type third semiconductor layer 42 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced.

Furthermore, the region of the n-type first semiconductor layer 6 extending at least from immediately below the p-type first guard ring layer 8 to the portion where the n-type second semiconductor layer 9 reaches the n-type first semiconductor layer 6, constitutes an n(+)-type third semiconductor 42 layer having a higher impurity concentration than the n-type first semiconductor layer 6. Hence, the resistance of the current path C2 for flow from the first guard ring layer through the n(−)-type base layer 1 and the n(+)-type third semiconductor layer 42 to the n-type second semiconductor layer 9 can be made lower than that of Embodiment 1. Consequently, the on-resistance of the free-wheeling diode can be further reduced as compared with Embodiment 1.

In this variation, the n-type first semiconductor layer 6 is not completely turned into the n(+)-type third semiconductor layer 42 having a high impurity concentration. This is because if the impurity concentration of the n-type first semiconductor layer 6 is increased in the IGBT region 13, injection of holes from the p(+)-type collector layer 7 into the n(−)-type base layer 1 is suppressed in the IGBT region 13 in the on-state of the IGBT, hence increasing the collector-emitter on-resistance in the IGBT region 13.

An example method for forming the n(+)-type third semiconductor layer 42 is as follows. After the n-type first semiconductor layer 6 is formed, an n-type impurity is ion-implanted into the region of the n-type first semiconductor layer 6 extending from immediately below the p-type first guard ring layer 8 to the portion where the n(+)-type second semiconductor layer 9 reaches the n-type first semiconductor layer 6. Subsequently, an n(−)-type base layer 1 is formed by epitaxial growth. Thus, the n(+)-type third semiconductor layer 42 can be formed.

Embodiment 2

Figure 6:
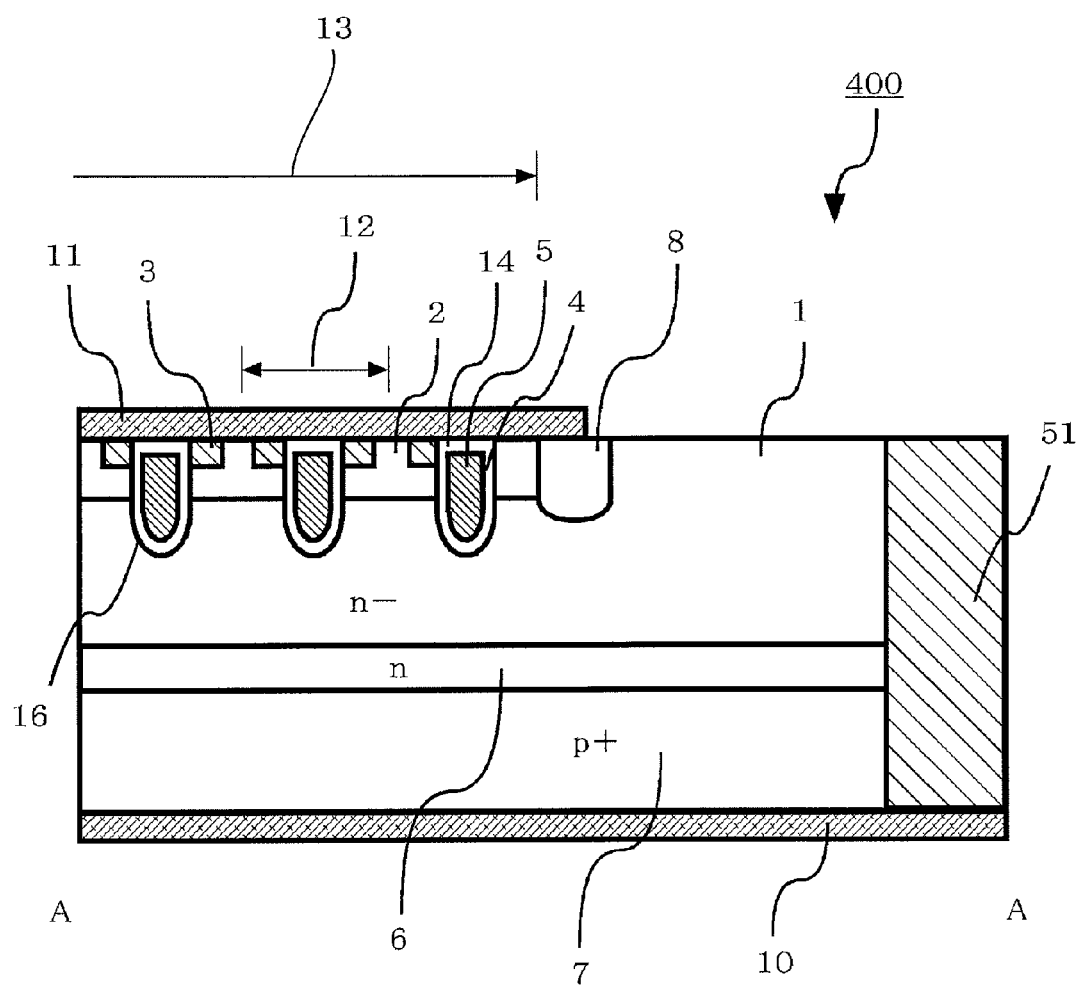
FIG. 6 is a cross-sectional view of the major part of a power semiconductor device of Embodiment 2 of the invention.

FIG. 6 is a sectional view of the major part of a power semiconductor device 400 of Embodiment 2 of the invention. The plan view of the power semiconductor device 400 is generally the same as FIG. 1, and FIG. 6 corresponds to the sectional view of the A-A cross section of FIG. 1 as viewed in the direction of the arrows. In the following description, portions identical or similar to those of the above Embodiment 1 are labeled with like reference numerals, and only the portions different from those of Embodiment 1 are described.

The power semiconductor device 400 of this embodiment is different from the power semiconductor device 100 of Embodiment 1 in that the n(+)-type second semiconductor layer 9 reaching the n-type first semiconductor layer 6 is replaced by an n(+)-type second semiconductor layer 51 reaching the first main electrode 10. The rest is similar to Embodiment 1. This difference is described below.

The n(+)-type second semiconductor layer 51 of the power semiconductor device 400 of this embodiment has a structure surrounding the first guard ring layer 8, preferably a ring-shaped structure surrounding the first guard ring layer 8, extends from the first surface toward the second surface of the n(−)-type base layer 1, penetrates through the n-type first semiconductor layer 6 and the p(+)-type collector layer 7, reaches the first main electrode 10, and is electrically connected to the first main electrode. Here, the ring-shaped structure of the second semiconductor layer 51 may, in its entire region, penetrate through the n-type first semiconductor layer 6 and the p(+)-type collector layer 7 and reach the first main electrode 10, but this is not necessary. In other words, it may penetrate through the n-type first semiconductor layer 6 and the p(+)-type collector layer 7 and be connected to the first main electrode 10 while maintaining the ring-shaped structure, but this is not necessary. For instance, the n-type second semiconductor layer 51 may have a structure of extending from the first surface toward the second surface of the n(−)-type base layer 1 and being connected to the n-type first semiconductor layer 6 while maintaining the ring-shaped structure, part of the ring-shaped structure being further turned into a columnar structure, which penetrates through the n-type first semiconductor layer 6 and the p(+)-type collector layer 7 and reaches the first main electrode 10. The portion of the n(+)-type second semiconductor layer 51 penetrating through the n-type first semiconductor layer 6 and the p(+)-type collector layer 7 only needs to have a structure of enabling the n-type first semiconductor layer 6 and the n(+)-type second semiconductor layer 51 to be electrically connected to the first main electrode 10.

The aforementioned n(+)-type second semiconductor layer 51 is directly joined to the first main electrode 10. Thus, the free-wheeling diode in which the p-type first guard ring layer 8 and the p-type base layer 2 serve as an anode layer and the n-type first semiconductor layer 6 and the n(+)-type second semiconductor layer 51 serve as a cathode layer, is connected in reverse parallel to the IGBT region 13. In contrast to Embodiment 1, there is no need to provide a cathode electrode 15 electrically joined to the upper surface of the n(+)-type second semiconductor layer 51, and there is no need of wire bonding and the like for electrically joining the cathode electrode 15 to the lead frame on which the power semiconductor device 400 is mounted via the first main electrode. This further simplifies assembly of the semiconductor device.

Like the free-wheeling diode of the power semiconductor device 100 of Embodiment 1, the power semiconductor device 400 of this embodiment also has a structure in which the n(+)-type second semiconductor layer 51 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 51 to function as a cathode layer, but also the n-type first semiconductor layer 6 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced.

Embodiment 3

Figure 7:
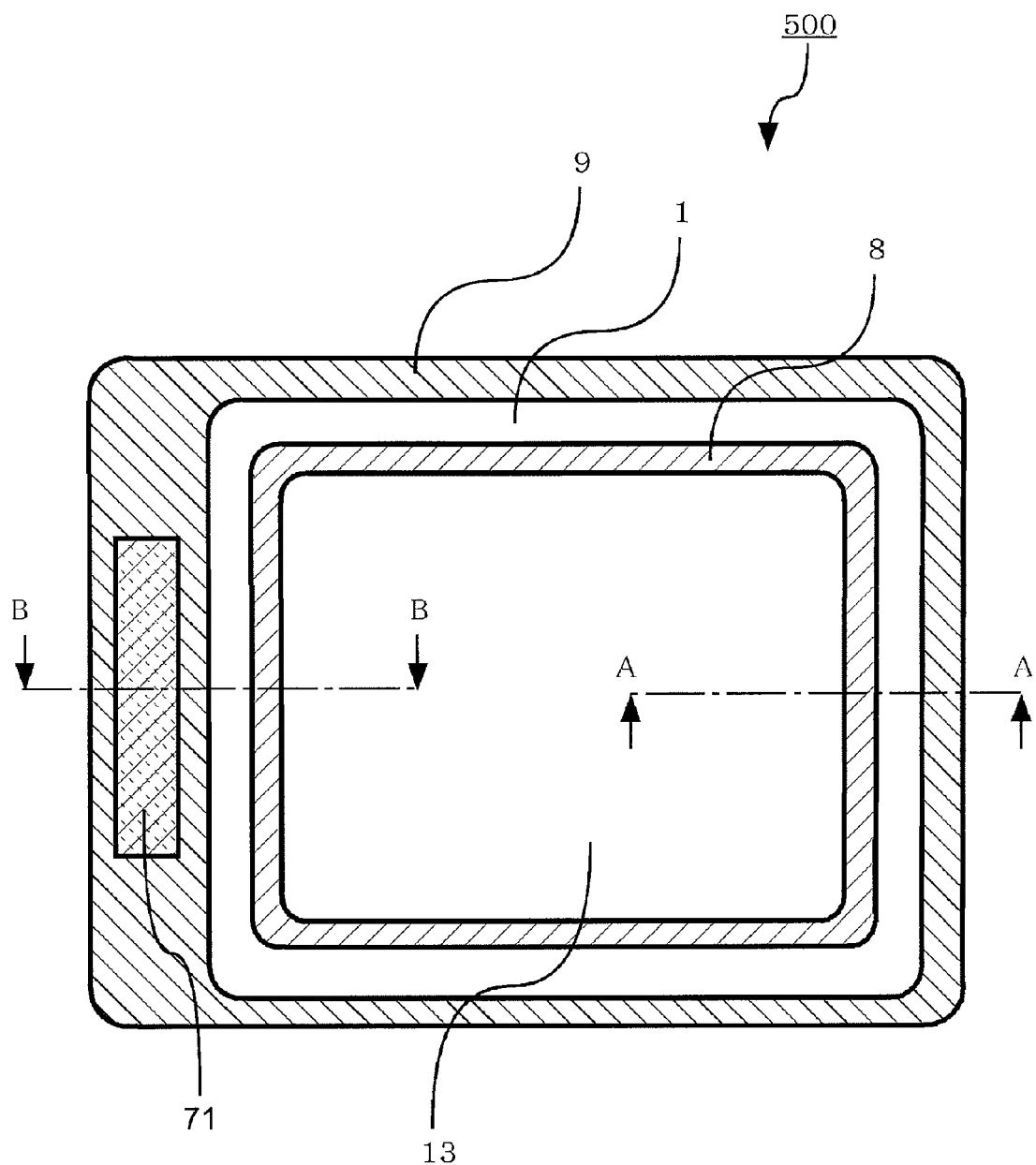
FIG. 7 is a plan view of a power semiconductor device of Embodiment 3 of the invention.
Figure 8:
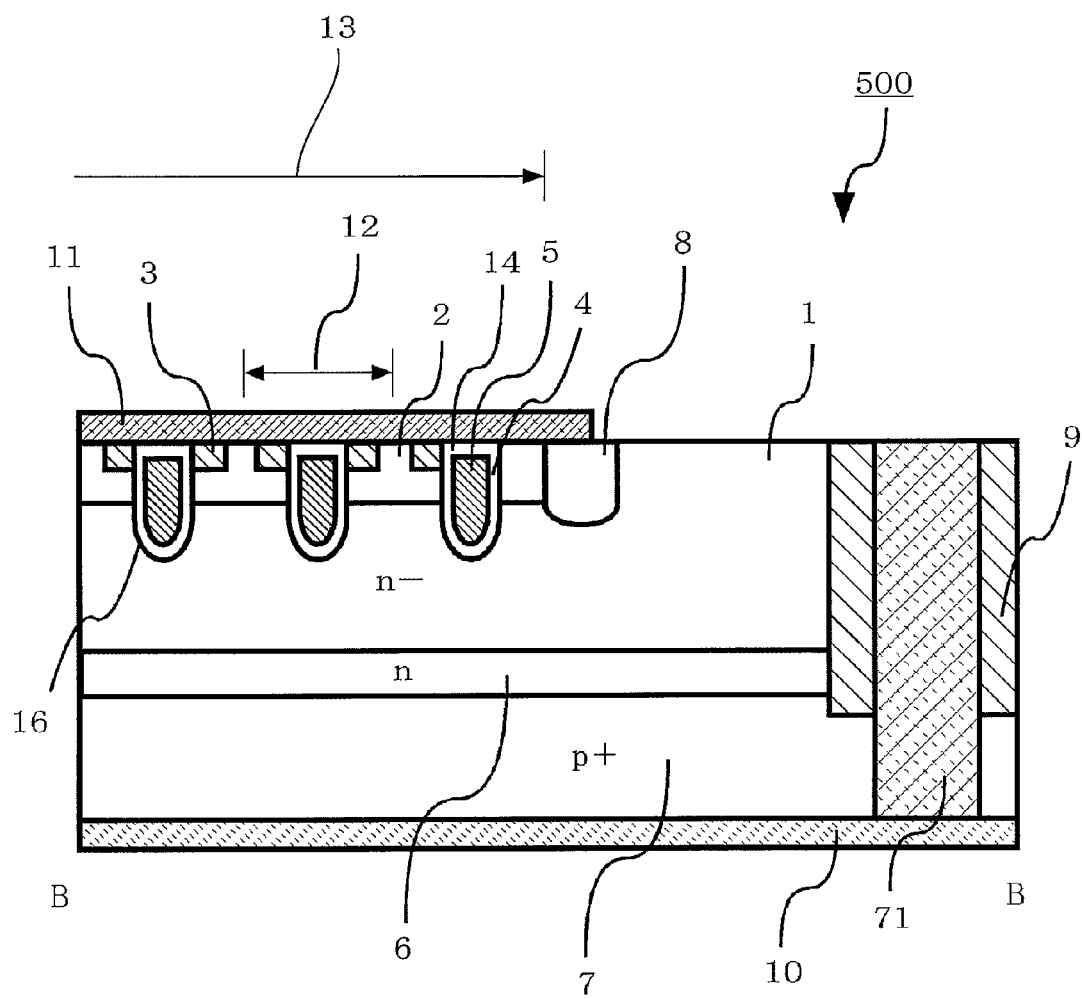
FIG. 8 is a cross-sectional view of the major part of the power semiconductor device of Embodiment 3 of the invention.

FIG. 7 shows a plan view of a power semiconductor device 500 of Embodiment 3 of the invention, and FIG. 8 is a sectional view in which the B-B cross section in FIG. 7 is viewed in the direction of the arrows. The sectional view in which the A-A cross section of FIG. 7 is viewed in the direction of the arrows is the same as FIG. 2. In the following description, portions identical or similar to those of the above Embodiment 1 are labeled with like reference numerals, and only the portions different from those of Embodiment 1 are described.

The power semiconductor device 500 of this embodiment is different from the power semiconductor device 100 of Embodiment 1 in further including a conductor 71 which passes through part of the cross section, parallel to the first surface of the n(−)-type base layer 1, of the n(+)-type second semiconductor layer 9 surrounding the p-type first guard ring layer 8, extends from the first surface of the n(−)-type base layer 1 to the first main electrode 10, and is electrically connected to the first main electrode 10. In other words, the conductor 71 penetrates from the first surface of the n(−)-type base layer 1 through the n(+)-type second semiconductor layer 9 and the p(+)-type collector layer 7 to the first main electrode 10 and is electrically connected to the first main electrode 10 so that the n(+)-type second semiconductor layer 9 is electrically connected to the first main electrode 10. Thus, the free-wheeling diode in which the p-type first guard ring layer 8 and the p-type base layer 2 serve as an anode layer and the n-type first semiconductor layer 6 and the n(+)-type second semiconductor layer 9 serve as a cathode layer is connected in reverse parallel to the IGBT region 13.

The conductor 71 only needs to be made of a conductive material, and either a semiconductor layer or a metal may be used. For instance, a conductive material having good filling capability, such as polysilicon as a semiconductor, or tungsten as a metal, is preferable. The conductor 71 can be formed by forming a via penetrating from the first surface of the n(−)-type base layer 1 through the n(+)-type second semiconductor layer 9 and the p(+)-type collector layer 7 to the first main electrode 10, by etching or the like, and burying a conductor 71 in this via.

Also in the power semiconductor device 500 of this embodiment, like the power semiconductor device 400 of Embodiment 2, in contrast to the power semiconductor device 100 of Embodiment 1, there is no need to provide a cathode electrode 15 electrically joined to the upper surface of the n(+)-type second semiconductor layer 9, and there is no need of wire bonding and the like for electrically joining the cathode electrode 15 to the lead frame on which the power semiconductor device 500 is mounted via the first main electrode. This further simplifies assembly of the semiconductor device.

Like the free-wheeling diode of the power semiconductor device 100 of Embodiment 1, the power semiconductor device 500 of this embodiment also has a structure in which the second semiconductor layer 9 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 9 to function as a cathode layer, but also the n-type first semiconductor layer 6 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced.

In the power semiconductor device 500 of this embodiment, the conductor 71 is made of a metal material. Hence, the on-resistance of the free-wheeling diode can be further reduced as compared with the power semiconductor device 400 of Embodiment 2.

Furthermore, this embodiment has a structure in which a via extending from the first surface of the n(−)-type base layer 1 to the first main electrode 10 is formed in the n(+)-type second semiconductor layer 9 and the conductor 71 is buried in this via. This is different from the structure in which the conductor 71 is exposed to the chip end portion of the power semiconductor device 500. However, the chip can be diced along the extending direction of the n(+)-type second semiconductor layer 9 so that the dicing line cuts the conductor 71 to separate the chip, allowing a structure in which the conductor 71 is exposed to the chip end portion (dicing plane).

Embodiment 4

Figure 9:
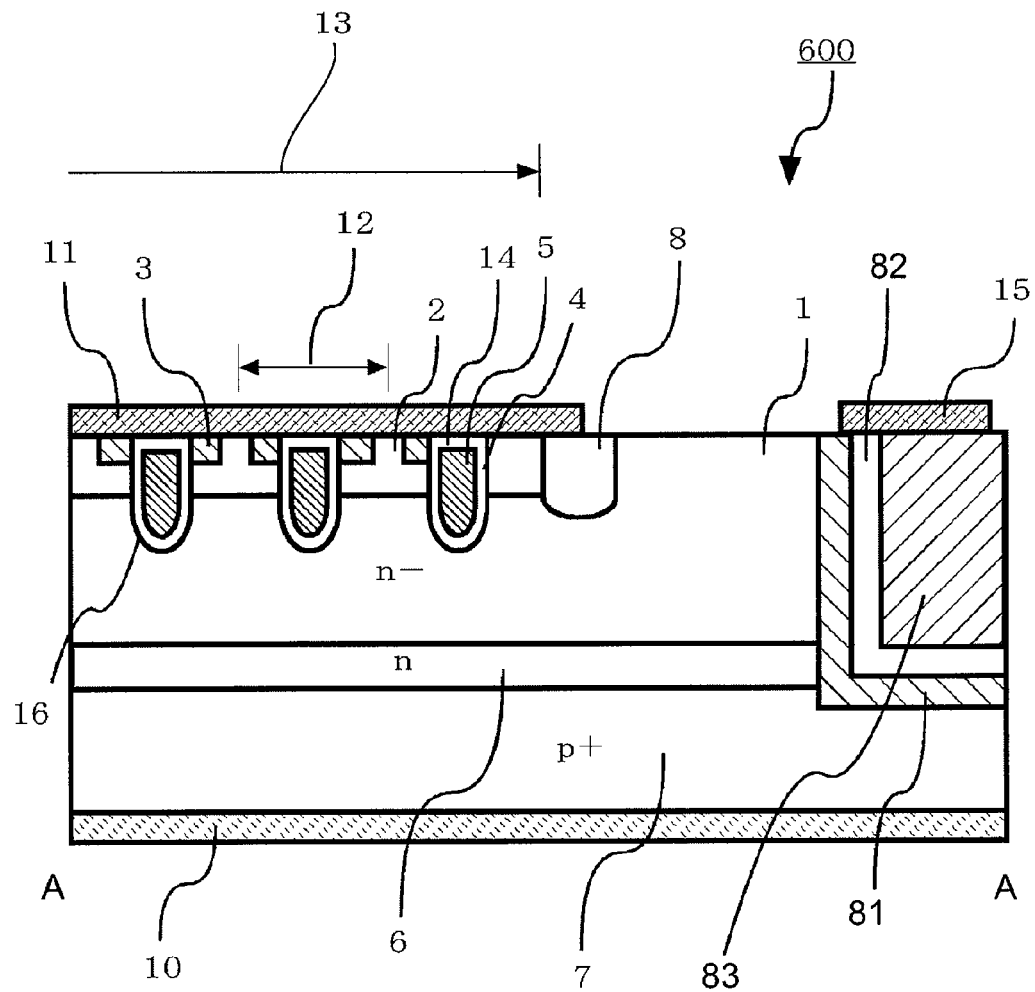
FIG. 9 is a cross-sectional view of the major part of a power semiconductor device of Embodiment 4 of the invention.

FIG. 9 is a sectional view of the major part of a power semiconductor device 600 of Embodiment 4 of the invention. The plan view of the power semiconductor device 600 is generally the same as FIG. 1, and FIG. 9 corresponds to the sectional view of the A-A cross section of FIG. 1 as viewed in the direction of the arrows. In the following description, portions identical or similar to those of the above Embodiment 1 are labeled with like reference numerals, and only the portions different from those of Embodiment 1 are described.

The power semiconductor device 600 of this embodiment is different from the power semiconductor device 100 of Embodiment 1 in that a buried layer 83 is formed in the n(+)-type second semiconductor layer 81 via an insulating film 82. The insulating film 82 only needs to be made of an insulating material, such as oxide film and nitride film. Because the buried layer 83 is intended for being buried, it may be made of either a conductive material or an insulating material. As an example, it can be a polysilicon layer or the like.

An example method for forming the n(+)-type second semiconductor layer 81, the insulating film 82, and the buried layer 83 is as follows. A trench extending from the first surface to the second surface of the n(−)-type base layer 1 is formed around the p-type first guard ring layer 8, preferably in a ring-shaped structure. An n-type impurity such as P (phosphorus) or As (arsenic) is ion-implanted into the sidewall and bottom of the trench, and then thermally diffused. Thus, an n(+)-type second semiconductor layer 81 can be formed. Alternatively, after the trench is formed, the sidewall and bottom of the trench are exposed to an atmosphere containing $POCl_3$ (phosphorus oxychloride) at high temperature so that phosphorus is diffused from the sidewall and bottom of the trench into the n(−)-type base layer 1, and thus an n(+)-type second semiconductor layer 81 can be formed.

Subsequently, the surface of the n(+)-type second semiconductor layer 81 formed at the sidewall and bottom of the trench is thermally oxidized to form an oxide film ($SiO_2$) constituting an insulating film 82. Alternatively, this formation of the insulating film 82 may be based on deposition of $SiO_2$ film or nitride film (SiN) by CVD (chemical vapor deposition). In any case, the insulating film 82 is formed along the sidewall and bottom of the trench and directly inherits the shape of the trench.

Subsequently, after a buried layer 83 is formed so as to fill the trench, the surface of the buried layer 83 is made flush with the first surface of the n(−)-type base layer 1 by a surface planarization process such as CMP (chemical mechanical polishing) or CDE (chemical dry etching). Here, the buried layer 83 may be made of either a conductive material or an insulating material as long as it can be buried flat. An example material having good filling capability can be polysilicon as a semiconductor or tungsten as a metal. In this embodiment, the buried layer 83 is formed via the insulating film 82. However, without the intermediary of the insulating film 82, the buried layer 83 can also be directly formed on the surface of the n(+)-type second semiconductor layer 81 to fill the trench. In the case where silicon is formed on the surface of the insulating film 82 by CVD, a silicon epitaxial layer is not formed, but polysilicon is deposited. Because polysilicon has higher trench filling capability than a silicon epitaxial layer, it is preferable that a buried layer 83 made of polysilicon be buried via the insulating film 82. The structure according to this embodiment is characterized in that a deep n-type second semiconductor layer 81 serving as a cathode region of the diode can be easily formed. In other words, while deep diffusion, or trench formation followed by epitaxial formation, is needed to form a deep n-type second semiconductor layer 9 according to Embodiment 1 and the like, this embodiment is characterized in that burying can be easily performed using polysilicon and the like.

Like the free-wheeling diode of the power semiconductor device 100 of Embodiment 1, the power semiconductor device 600 of this embodiment also has a structure in which the n(+)-type second semiconductor layer 81 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 81 to function as a cathode layer, but also the n-type first semiconductor layer 6 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced.

In the power semiconductor device 600 of this embodiment, the cathode electrode is formed on the surface of the n(+)-type second semiconductor layer 81, preferably on the surface of the buried layer 83 as well, so as to be electrically connected at least to the n(+)-type second semiconductor layer 81.

Embodiment 5

Figure 10A:
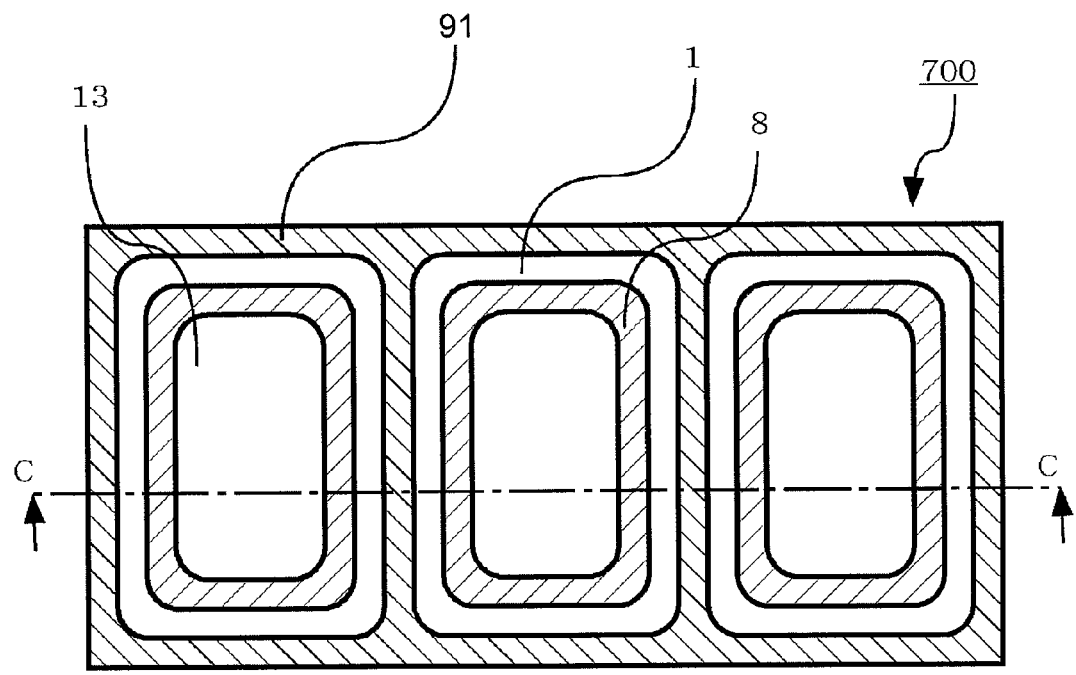
FIG. 10A is a plane view of a power semiconductor device of Embodiment 5 of the invention and FIG. 10B is a cross-sectional view of the major part thereof.
Figure 10B:
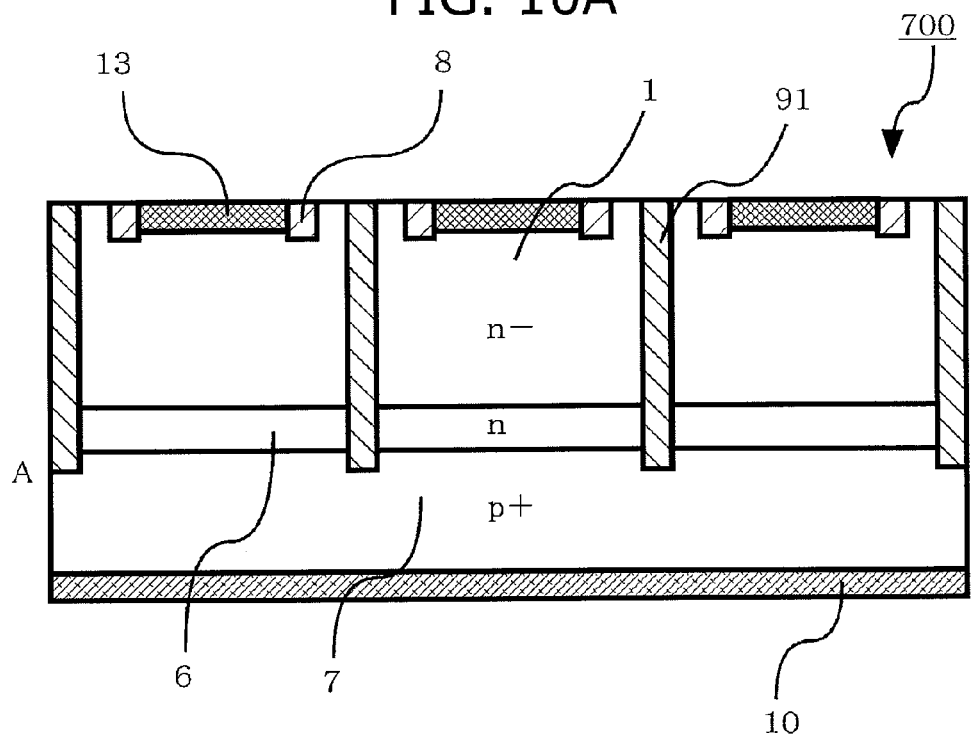

FIGS. 10A and 10B show schematic views of a power semiconductor device 700 of Embodiment 5 of the invention, where FIG. 10A is a plan view thereof, and FIG. 10B is a schematic view of the C-C cross section of FIG. 10A as viewed in the direction of the arrows. In FIG. 10A, a p-type first guard ring layer 8, n(−)-type base layer 1, n(+)-type second semiconductor layer 91, and IGBT region 13 are shown in plan view, but the detailed structure in the IGBT region 13 and other components are omitted. In FIG. 10B, the detailed structure of the IGBT region 13 is as shown in the cross section of FIG. 2, and hence is omitted.

As shown in the plan view of FIG. 10A in which the power semiconductor device 100 illustrated in Embodiment 1 is used as a unit, the power semiconductor device 700 of this embodiment is formed by repeating the structure of the power semiconductor device 100 three times laterally in the semiconductor chip. Here, the structure of the IGBT region 13 has the same cross-sectional structure as the IGBT region of Embodiment 1 shown in FIG. 2, and its detail is omitted. The power semiconductor devices 100 are formed successively and repeatedly so that the adjacent power semiconductor devices 100 share the adjacent portion of the n(+)-type second semiconductor layer 9. Consequently, the n(+)-type second semiconductor layer 9 of Embodiment 1 is formed like a ladder, constituting an n(+)-type second semiconductor layer 91 in which the IGBT region 13 is formed in the opening of the ladder. The n(+)-type second semiconductor layer 91 has a planar shape surrounding each IGBT region 13 in the opening of the ladder.

More specifically, the power semiconductor device 700 is configured as follows. The IGBT region 13 is composed of a plurality of IGBT units described in Embodiment 1. Each of the IGBT units includes an n-type (first conductivity-type) base layer 1 having a first surface and a second surface opposed to the first surface. A p-type (second conductivity-type) base layer is selectively formed on the first surface of the n(−)-type base layer. An n-type emitter layer 3 is formed in the surface of the p-type base layer 2 opposite to the n(−)-type base layer 1. A gate electrode 5 is formed on the n(−)-type base layer 1, the p-type base layer 2, and the n-type emitter layer 3 via a gate insulating film 4. An n-type first semiconductor layer 6 having a higher impurity concentration than the n(−)-type base layer 1 is formed on the second surface of the n(−)-type base layer 1. A p(+)-type collector layer 7 is formed in the surface of the n-type first semiconductor layer 6 opposite to the n(−)-type base layer 1.

The aforementioned IGBT regions 13 are arranged so as to repeat three units, and a p-type first guard ring layer 8 is formed deeper than the p-type base layer 2 from the first surface toward the second surface of the n(−)-type base layer 1 so as to surround each of the IGBT regions 13 in a ring shape. A first main electrode 10 is formed on the surface of the p(+)-type collector layer 7 opposite to the n-type first semiconductor layer 6. A second main electrode 11 (not shown) is formed, electrically connected onto the n-type emitter layer 3 and the p-type base layer 2 and onto the p-type first guard ring layer 8, and insulated from the gate electrode 5 by an interlayer insulating film.

Furthermore, an n(+)-type second semiconductor layer 91 is formed from the first surface of the n(−)-type base layer 1 to the n-type first semiconductor layer so as to surround each of the IGBT regions 13 and each of the p-type first guard ring layers 8 in a ring shape. In other words, the n(+)-type second semiconductor layer 91 is formed like a ladder, and each of the IGBT regions 13 surrounded by the p-type first guard ring layer 8 is arranged in its opening.

Like Embodiment 1, a cathode electrode 15 (not shown) is formed on and electrically connected to the surface of the n(+)-type second semiconductor layer 91. By wire bonding or the like, the cathode electrode 15 is electrically connected (not shown) to a lead frame on which the power semiconductor device 700 is electrically connected and mounted via the first main electrode 10.

Like Embodiment 1, by the aforementioned electrode connection, in each of the plurality of IGBT regions 13, an IGBT structure is formed in which the first main electrode acts as a collector electrode, the second main electrode 11 acts as an emitter electrode, and the current flowing from the first main electrode 10 toward the second main electrode 11 is controlled by the gate electrode 5. Furthermore, a free-wheeling diode is formed in which the p-type first guard ring layer 8 and the p-type base layer 2 function as an anode layer and the n-type first semiconductor layer 6 and the n(+)-type second semiconductor layer 91 function as a cathode layer. The p-type first guard ring layer 8 and the p-type base layer 2 serving as an anode layer are connected to the second main electrode, and the n-type first semiconductor layer 6 and the n(+)-type second semiconductor layer 91 serving as a cathode layer are electrically connected to the first main electrode 10 via the cathode electrode 15. Thus, this free-wheeling diode constitutes a reverse parallel connection with the IGBT region, and they are formed in the same semiconductor chip.

Like the free-wheeling diode of the power semiconductor device 100 of Embodiment 1, the power semiconductor device 700 of this embodiment also has a structure in which the n(+)-type second semiconductor layer 91 serving as a cathode layer extends from the first surface toward the second surface of the n(−)-type base layer 1, reaches the n-type first semiconductor layer 6, and is electrically connected to the n-type first semiconductor layer 6. Hence, it is characterized in causing not only the n(+)-type second semiconductor layer 91 to function as a cathode layer, but also the n-type first semiconductor layer 6 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced. Furthermore, the area occupied by the free-wheeling diode in a chip can be increased as compared with the power semiconductor device 100 of Embodiment 1, and hence the current capacity of the free-wheeling diode can be increased.

This embodiment has a structure in which the IGBT region 13 is laterally repeated three times. However, naturally, it is also possible to repeat more times. Furthermore, it is also possible to repeat multiple times both longitudinally and laterally in a matrix arrangement. In addition, the technical features of Variations 1 or 2 of Embodiment 1 are also applicable to this embodiment. In other words, the trench gate structure can be replaced by a planar gate structure. Naturally, the p-type second guard ring layer and the n-type third semiconductor layer are also applicable to this embodiment.

In this embodiment, a cathode electrode 15, not shown, is formed on the surface of the n(+)-type second semiconductor layer 91, and electrically connected (not shown), by wire bonding or the like, to a lead frame on which the power semiconductor device 700 is mounted via the first main electrode 10. Thus, the cathode layer is electrically connected to the first main electrode. The electrical connection between the cathode layer and the first main electrode in this embodiment can be based on an n(+)-type second semiconductor layer 51 or a conductor 71 as illustrated in Embodiment 2 or 3. Alternatively, as illustrated in Embodiment 4, it can be based on the n(+)-type second semiconductor layer 81, insulating film 82, buried layer 83, and cathode electrode 15.

Embodiment 6

Figure 11:
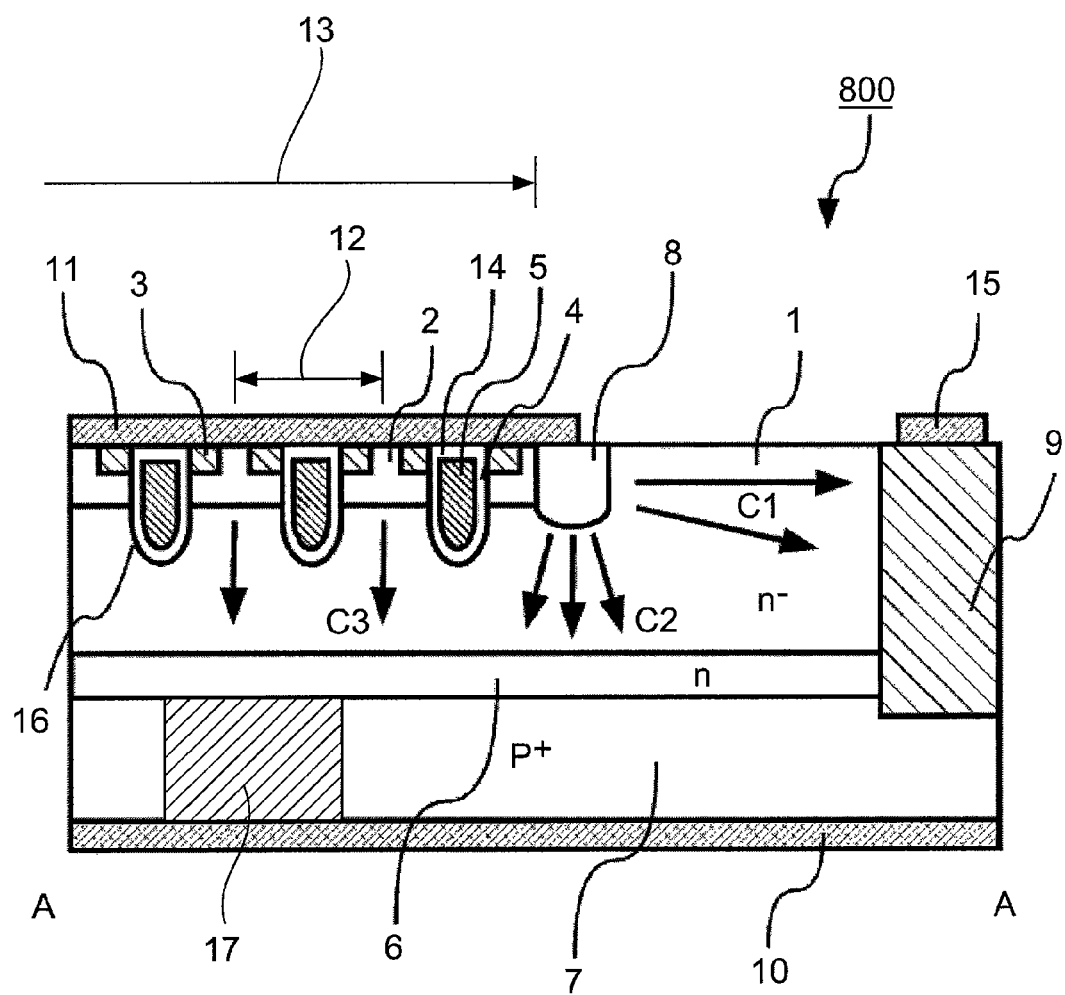
FIG. 11 is a cross-sectional view of the major part of a power semiconductor device of Embodiment 6 of the invention.

FIG. 11 is a sectional view of the major part of a power semiconductor device 800 of Embodiment 6 of the invention. The plan view of the power semiconductor device 800 is generally the same as FIG. 1, and FIG. 11 corresponds to the sectional view of the A-A cross section of FIG. 1 as viewed in the direction of the arrows. In the following description, portions identical or similar to those of the above Embodiment 1 are labeled with like reference numerals, and only the portions different from those of Embodiment 1 are described.

The power semiconductor device 800 of this embodiment is different from the power semiconductor device 100 of Embodiment 1 in that an n(+)-type fourth semiconductor layer 17 is further formed in the p(+)-type collector layer 7 below the IGBT region 13. The n(+)-type fourth semiconductor layer penetrates through the p(+)-type collector layer 7 and is connected to the n-type first semiconductor layer 6 on one hand and to the first main electrode on the other. The connection between the n(+)-type fourth semiconductor layer and the n-type first semiconductor layer 6 and the connection between the n(+)-type fourth semiconductor layer and the first main electrode allow intervention of other conductive layers therebetween as long as electrical connection is ensured. The n(+)-type fourth semiconductor layer can be formed as a plurality of stripes extending in the plane parallel to the first surface of the n(−)-type base layer 1. Alternatively, the n(+)-type fourth semiconductor layer can be formed like a lattice or discretely distributed as a plurality of pinholes in the plane parallel to the first surface of the n(−)-type base layer 1.

In this embodiment, like the n(+)-type second semiconductor layer 9, the n(+)-type fourth semiconductor layer 17 also functions as a cathode layer. In other words, a diode is formed in which the current flows along the second main electrode 11, p-type base layer 2, n(−)-type base layer 1, n-type first semiconductor layer 6, n(+)-type fourth semiconductor layer 17, and first main electrode 10.

Like the free-wheeling diode of the power semiconductor device 100 of Embodiment 1, the power semiconductor device 800 of this embodiment also has a structure in which the n(+)-type second semiconductor layer 9 serving as a cathode layer extends from the first surface toward the second surface of the n(−)-type base layer 1, reaches the n-type first semiconductor layer 6, and is electrically connected thereto. Hence, it is characterized in causing not only the n(+)-type second semiconductor layer 9 to function as a cathode layer, but also the n-type first semiconductor layer 6 to function as a cathode layer. Consequently, in addition to flowing near the surface of the n(−)-type base layer 1 (including the current path C1 near the surface), the current of the free-wheeling diode also includes the current paths C2 and C3 for flow in the depth direction, and hence the on-resistance of the free-wheeling diode can be reduced.

Furthermore, a diode is formed in which the current flows along the second main electrode 11, p-type base layer 2, n(−)-type base layer 1, n-type first semiconductor layer 6, n(+)-type fourth semiconductor layer 17, and first main electrode 10. Hence, the on-resistance of the free-wheeling diode can be further reduced as compared with Embodiment 1.

The aspects according to the invention have been described with reference to the above embodiments. However, the invention is not limited to the configuration illustrated in the embodiments, and it is understood that the constituent material, layer thickness, pattern configuration and the like can be modified within the scope not departing from the spirit of the invention. Furthermore, the film formation method, film formation condition, etching method, and etching condition of the layers, or the method for planarizing the substrate surface and the like, can be modified within the scope not departing from the spirit of the invention.

In particular, it is understood that each structural difference from Embodiment 1 described in Embodiments 2 to 5 is also applicable to Variations 1 and 2 of Embodiment 1.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modification as would fall within the scope and spirit of the inventions.

The invention claimed is:

1. A power semiconductor device comprising:
an IGBT region including a plurality of IGBT units,
each of the IGBT units including:
 a first conductivity-type base layer having a first surface and a second surface opposed to the first surface;
 a second conductivity-type base layer selectively formed on the first surface of the first conductivity-type base layer;
 a first conductivity-type emitter layer formed in a surface of the second conductivity-type base layer opposite to the first conductivity-type base layer;
 a gate electrode formed on the first conductivity-type base layer, the second conductivity-type base layer, and the first conductivity-type emitter layer via a gate insulating film;
 a first conductivity-type first semiconductor layer formed on the second surface of the first conductivity-type base layer, the first conductivity-type first semiconductor layer having a higher impurity concentration than the first conductivity-type base layer; and
 a second conductivity-type collector layer formed in a surface of the first conductivity-type first semiconductor layer opposite to the first conductivity-type base layer;
a first main electrode formed on a surface of the second conductivity-type collector layer opposite to the first conductivity-type first semiconductor layer;
a second main electrode electrically connected onto the first conductivity-type emitter layer and the second conductivity-type base layer and insulated from the gate electrode by an interlayer insulating film; and
a first conductivity-type second semiconductor layer extending from the first surface of the first conductivity-type base layer to the first conductivity-type first semiconductor layer around the IGBT region and electrically connected to the first main electrode.

2. The device according to claim 1, further comprising:
a second conductivity-type first guard ring layer formed in the first surface of the first conductivity-type base layer between the IGBT region and the first conductivity-type second semiconductor layer so as to surround the IGBT region.

3. The device according to claim 2, further comprising:
a second conductivity-type second guard ring layer formed in the first surface of the first conductivity-type base layer between the second conductivity-type first guard ring layer and the first conductivity-type second semiconductor layer apart from the second conductivity-type first guard ring layer and the first conductivity-type second semiconductor layer.

4. The device according to claim 2, further comprising:
a second conductivity-type RESURF layer formed in the first surface of the first conductivity-type base layer between the second conductivity-type first guard ring layer and the first conductivity-type second semiconductor layer, connected to the second conductivity-type first guard ring layer, being shallower than the second conductivity-type first guard ring layer, and extending toward the first conductivity-type second semiconductor layer.

5. The device according to claim 1, wherein at least part of the first conductivity-type second semiconductor layer penetrates through the first conductivity-type first semiconductor layer and the second conductivity-type collector layer, reaches the first main electrode, and is electrically connected to the first main electrode.

6. The device according to claim 1, further comprising:
a conductor extending from a surface of the first conductivity-type second semiconductor layer on a side of the second main electrode through the first conductivity-type second semiconductor layer to the first main electrode, and electrically connected to the first main electrode.

7. The device according to claim 1, further comprising:
a buried layer formed on a surface of a bottom and a sidewall of a trench via an insulator film,
the trench being formed in the first conductivity-type second semiconductor layer.

8. The device according to claim 1, wherein a region of the first conductivity-type first semiconductor layer extending at least from immediately below the second conductivity-type first guard ring layer to a portion where the first conductivity-type second semiconductor layer reaches the first conductivity-type first semiconductor layer is replaced by a first conductivity-type third semiconductor layer having a higher impurity concentration than the first conductivity-type first semiconductor layer.

9. The device according to claim 1, further comprising:
a first conductivity-type fourth semiconductor layer formed in the second conductivity-type collector layer below the IGBT region, electrically connected to the first conductivity-type first semiconductor layer on one hand, and electrically connected to the first main electrode on another hand.

10. A power semiconductor device comprising:
a plurality of IGBT regions, each of the IGBT regions including a plurality of IGBT units,
each of the IGBT units including:
 a first conductivity-type base layer having a first surface and a second surface opposed to the first surface;
 a second conductivity-type base layer selectively formed on the first surface of the first conductivity-type base layer;
 a first conductivity-type emitter layer formed in a surface of the second conductivity-type base layer opposite to the first conductivity-type base layer;
 a gate electrode formed on the first conductivity-type base layer, the second conductivity-type base layer, and the first conductivity-type emitter layer via a gate insulating film;
 a first conductivity-type first semiconductor layer formed on the second surface of the first conductivity-type base layer, the first conductivity-type first semiconductor layer having a higher impurity concentration than the first conductivity-type base layer; and
 a second conductivity-type collector layer formed in a surface of the first conductivity-type first semiconductor layer opposite to the first conductivity-type base layer;
a first main electrode formed on a surface of the second conductivity-type collector layer opposite to the first conductivity-type first semiconductor layer;
a second main electrode electrically connected onto the first conductivity-type emitter layer and the second conductivity-type base layer and insulated from the gate electrode by an interlayer insulating film; and a first conductivity-type second semiconductor layer extending from the first surface of the first conductivity-type base layer to the first semiconductor layer around each of the plurality of IGBT regions and electrically connected to the first main electrode.

11. The device according to claim 10, further comprising:
a plurality of second conductivity-type first guard ring layers formed in the first surface of the first conductivity-type base layer, each of the plurality of second conductivity-type first guard ring layers surrounding each of the plurality of IGBT regions between each of the plurality of IGBT regions and the first conductivity-type second semiconductor layer;
the second main electrode being electrically connected onto the second conductivity-type first guard ring layer.

12. The device according to claim 11, further comprising:
a second conductivity-type second guard ring layer formed in the first surface of the first conductivity-type base layer between the second conductivity-type first guard ring layer and the first conductivity-type second semiconductor layer apart from the second conductivity-type first guard ring layer and the first conductivity-type second semiconductor layer.

13. The device according to claim 11, further comprising:
a second conductivity-type RESURF layer formed in the first surface of the first conductivity-type base layer between the second conductivity-type first guard ring layer and the first conductivity-type second semiconductor layer, connected to the second conductivity-type first guard ring layer, being shallower than the second conductivity-type first guard ring layer, and extending toward the first conductivity-type second semiconductor layer.

14. The device according to claim 11, wherein a region of the first conductivity-type first semiconductor layer extending at least from immediately below the second conductivity-type first guard ring layer to a portion where the first conductivity-type second semiconductor layer reaches the first conductivity-type first semiconductor layer is replaced by a first conductivity-type third semiconductor layer having a higher impurity concentration than the first conductivity-type first semiconductor layer.

15. The device according to claim 10, wherein at least part of the first conductivity-type second semiconductor layer penetrates through the first conductivity-type first semiconductor layer and the second conductivity-type collector layer, reaches the first main electrode, and is electrically connected to the first main electrode.

16. The device according to claim 10, further comprising:
a conductor extending from a surface of the first conductivity-type second semiconductor layer on a side of the second main electrode through the first conductivity-type second semiconductor layer to the first main electrode, and electrically connected to the first main electrode.

17. The device according to claim 10, further comprising:
a buried layer formed on a surface of a bottom and a sidewall of a trench via an insulator film,
the trench being formed in the first conductivity-type second semiconductor layer.

18. The device according to claim 10, further comprising:
a first conductivity-type fourth semiconductor layer formed in the second conductivity-type collector layer below the IGBT region, electrically connected to the first conductivity-type first semiconductor layer on one hand, and electrically connected to the first main electrode on another hand.

* * * * *